US011917813B2

(12) United States Patent
Hsu

(10) Patent No.: US 11,917,813 B2
(45) Date of Patent: Feb. 27, 2024

(54) MEMORY ARRAY WITH CONTACT ENHANCEMENT CAP AND METHOD FOR PREPARING THE MEMORY ARRAY

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 104 days.

(21) Appl. No.: 17/528,617

(22) Filed: Nov. 17, 2021

(65) Prior Publication Data
US 2023/0157006 A1 May 18, 2023

(51) Int. Cl.
*H01L 27/108* (2006.01)
*H10B 12/00* (2023.01)

(52) U.S. Cl.
CPC ....... *H10B 12/315* (2023.02); *H10B 12/0335* (2023.02); *H10B 12/053* (2023.02); *H10B 12/34* (2023.02)

(58) Field of Classification Search
CPC ..... H01L 21/823412; H01L 21/823807; H01L 21/82384; H10B 12/0335; H10B 12/315; H10B 12/053; H10B 12/34
See application file for complete search history.

(56) References Cited

U.S. PATENT DOCUMENTS

| | | | | |
|---|---|---|---|---|
| 2009/0218633 A1* | 9/2009 | Hoentschel | ......... | H01L 27/1203 257/E21.632 |
| 2011/0062525 A1* | 3/2011 | Lavoie | ............ | H01L 21/823814 257/369 |
| 2012/0001254 A1* | 1/2012 | Kronholz | ........ | H01L 21/823807 257/E29.255 |
| 2012/0074502 A1* | 3/2012 | Ellis-Monaghan | ... | H01L 23/485 257/E21.598 |
| 2012/0112290 A1* | 5/2012 | Utomo | .................. | H01L 29/165 257/E27.06 |

(Continued)

FOREIGN PATENT DOCUMENTS

TW    202135313 A    9/2021

OTHER PUBLICATIONS

Rudy J. Wojtecki et al., "Reactive Monolayers in Directed Additive Manufacturing—Area Selective Atomic Layer Deposition" Journal of Photopolymer Science and Technology, 2018 vol. 31 Issue 3 pp. 431-436.

*Primary Examiner* — Mary A Wilczewski
*Assistant Examiner* — Jaesun Lee
(74) *Attorney, Agent, or Firm* — Muncy, Geissler, Olds & Lowe, P.C.

(57) ABSTRACT

The present disclosure provides a dynamic random access memory (DRAM) array. The memory array includes a semiconductor substrate, an isolation structure and contact enhancement sidewall spacers. The semiconductor substrate has a trench defining laterally separate active areas formed of surface regions of the semiconductor substrate. Top surfaces of a first group of the active areas are recessed with respect to top surfaces of a second group of the active areas. The isolation structure is filled in the trench and in lateral contact with bottom portions of the active areas. The contact enhancement sidewall spacers laterally surround top portions of the active areas, respectively.

6 Claims, 28 Drawing Sheets

(56) References Cited

U.S. PATENT DOCUMENTS

| | | | |
|---|---|---|---|
| 2012/0217553 A1* | 8/2012 | Luo | H01L 29/7834 |
| | | | 257/E21.409 |
| 2013/0015525 A1* | 1/2013 | Cheng | H01L 21/823814 |
| | | | 257/E21.632 |
| 2013/0049126 A1* | 2/2013 | Flachowsky | H01L 21/823807 |
| | | | 257/E21.409 |
| 2013/0087855 A1* | 4/2013 | Makiyama | H01L 21/84 |
| | | | 257/350 |
| 2013/0323893 A1* | 12/2013 | Chuang | H01L 21/823814 |
| | | | 257/E21.634 |
| 2014/0027816 A1 | 1/2014 | Cea et al. | |
| 2016/0104708 A1* | 4/2016 | Kim | H01L 29/0692 |
| | | | 257/369 |
| 2016/0329337 A1 | 11/2016 | Hwang et al. | |
| 2017/0287901 A1* | 10/2017 | Dersch | H01L 29/7838 |
| 2018/0083011 A1 | 3/2018 | Wang | |
| 2019/0181157 A1* | 6/2019 | Tsuboi | H01L 29/66628 |
| 2020/0144365 A1* | 5/2020 | Mulfinger | H01L 29/0847 |

* cited by examiner

MEMORY ARRAY WITH CONTACT ENHANCEMENT CAP AND METHOD FOR PREPARING THE MEMORY ARRAY

TECHNICAL FIELD

The present disclosure relates to a memory array, and more particularly, to a dynamic random access memory (DRAM) array.

DISCUSSION OF THE BACKGROUND

In recent decades, demand to storage capability has increased as electronic products continue to improve. In order to increase the storage capability of a memory device (e.g., a DRAM device), more memory cells are arranged in the memory device, and each memory cell in the memory device becomes smaller in size. The memory cells are respectively fabricated on an active area, which may be a portion of a semiconductor substrate. Scaling of the active areas is an alternative for reducing size of each memory cell.

Each DRAM cell may include a storage capacitor disposed over an active area and connected to the active area through a capacitor contact. Reduction of the active area may result in shrinkage of a landing area for the capacitor contact. Consequently, a contact resistance between the capacitor contact and the active area may increase due to lithography overlay issue. In other words, pursuing high storage density by minimizing the active areas may compromise performance of the DRAM device. A method for increasing the landing area for the capacitor contact without expanding layout patterns of the active areas is required in the art.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a memory array is provided. The memory array comprises: a semiconductor substrate, with a trench defining laterally separate active areas formed of surface regions of the semiconductor substrate, wherein top surfaces of a first group of the active areas are recessed with respect to top surfaces of a second group of the active areas; an isolation structure, filled in the trench and in lateral contact with bottom portions of the active areas; and contact enhancement sidewall spacers, laterally surrounding top portions of the active areas, respectively.

In another aspect of the present disclosure, a memory array is provided. The memory array comprises: active areas, formed of laterally separate surface portions of a semiconductor substrate, wherein top surfaces of a first group of the active areas are recessed with respect to top surfaces of a second group of the active areas; an isolation structure, extending between the active areas, and in contact with bottom portions of the active areas; and contact enhancement caps, capping top portions of the active areas, respectively.

In yet another aspect of the present disclosure, a method for preparing a memory array is provided. The method includes: forming a trench at a front side of a semiconductor substrate, wherein the trench defines laterally separate active areas formed of surface regions of the semiconductor substrate; filling an isolation structure in the trench, wherein the isolation structure is filled to a height lower than top surfaces of the active areas; recessing a first group of the active areas from top surfaces of the first group of the active areas, while having top surfaces of a second group of the active areas covered; and forming contact enhancement sidewall spacers to laterally surround top portions of the active areas, respectively.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
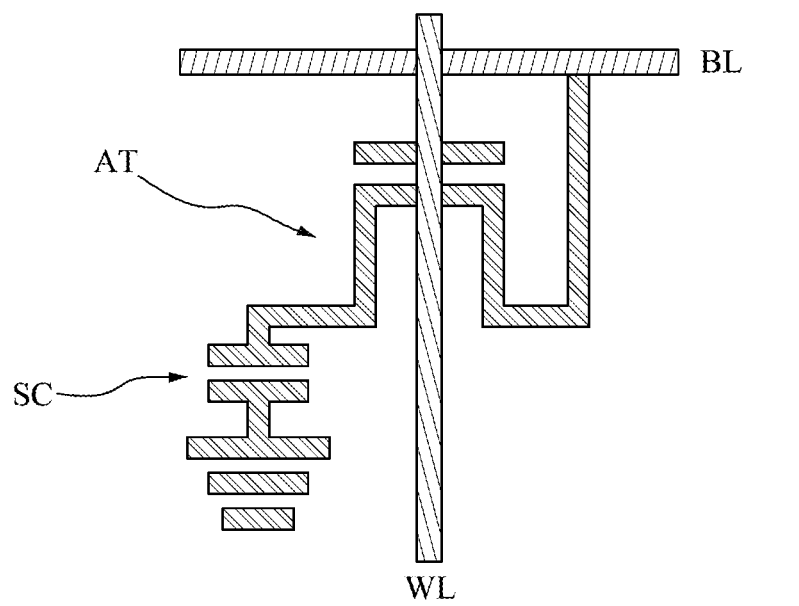
FIG. 1A is a circuit diagram illustrating a memory cell in a memory array, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a circuit diagram illustrating a memory cell 100 in a memory array structure, according to some embodiments of the present disclosure. Referring to FIG. 1A, the memory array structure may be a dynamic random access (DRAM) array. Each memory cell 100 in the memory array structure may include an access transistor AT and a storage capacitor SC. The access transistor AT may be a field effect transistor (FET). A terminal of the storage capacitor SC is coupled to a source/drain terminal of the access transistor AT, while the other terminal of the storage capacitor SC may be coupled to a reference voltage (e.g., a ground voltage as depicted in FIG. 1A). When the access transistor AT is turned on, the storage capacitor SC can be accessed. On the other hand, when the access transistor AT is in an off state, the storage capacitor SC is inaccessible.

During a write operation, the access transistor AT is turned on by asserting a word line WL coupled to a gate terminal of the access transistor AT, and a voltage applied on a bit line BL coupled to a source/drain terminal of the access transistor AT may be transferred to the storage capacitor SC coupled the other source/drain terminal of the access transistor AT. Accordingly, the storage capacitor SC may be charged or discharged, and a logic state "1" or a logic state "0" can be stored in the storage capacitor SC. During a read operation, the access transistor AT is turned on as well, and the bit line BL being pre-charged may be pulled up or pulled down according to a charge state of the storage capacitor SC. By comparing a voltage of the bit line BL with the pre-charge voltage, the charge state of the storage capacitor SC can be sensed, and the logic state of the memory cell 100 can be identified.

Figure 1B:
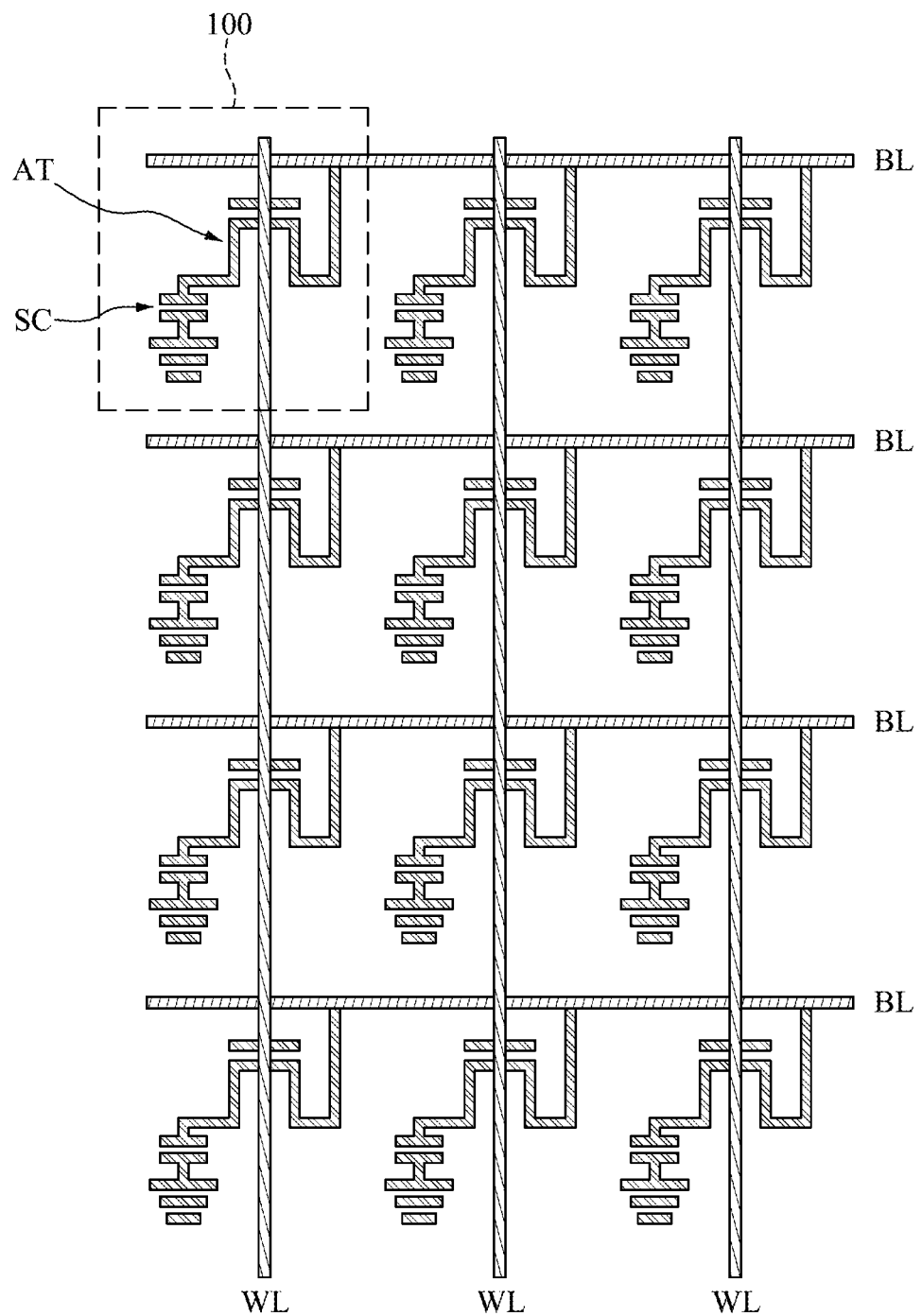
FIG. 1B is a memory array including a plurality of the memory cells, according to some embodiments of the present disclosure.

FIG. 1B is a memory array structure 10 including a plurality of the memory cells 100, according to some embodiments of the present disclosure. Referring to FIG. 1B, the memory array structure 10 has rows and columns. The memory cells 100 in each row may be arranged along a first direction, while the memory cells 100 in each column may be arranged along a second direction intersected with the first direction. A plurality of the bit lines BL may be respectively coupled to a row of the memory cells 100. On the other hand, a plurality of the word lines WL may be respectively coupled to a column of the memory cells 100. In some embodiments, during a write operation, a word line WL coupled to a selected memory cell 100 is asserted, and the storage capacitor SC in the selected memory cell 100 is programmed by a voltage provided to a bit line coupled to the selected memory cell 100. In addition, during a read operation, all of the bit lines BL are pre-charged, and a word line WL coupled to the selected memory cell 100 is asserted, then the pre-charged bit lines BL are further pulled up or pulled down by the storage capacitors SC of the memory cells 100 coupled to the asserted word line WL, respectively. By detecting the voltage variation of a bit line BL coupled to the selected memory cell 100, the logic state of the selected memory cell 100 can be identified. As a result of pulling up/down the pre-charged bit lines BL, the charges stored in the storage capacitors SC of the memory cells 100 coupled to the asserted word line WL are altered. In order to restore logic states of these memory cells 100, the read operation may be followed by a write operation for programming the previous logic states to these memory cells 100, and such write operation may also be referred as a refresh operation.

Figure 2A:
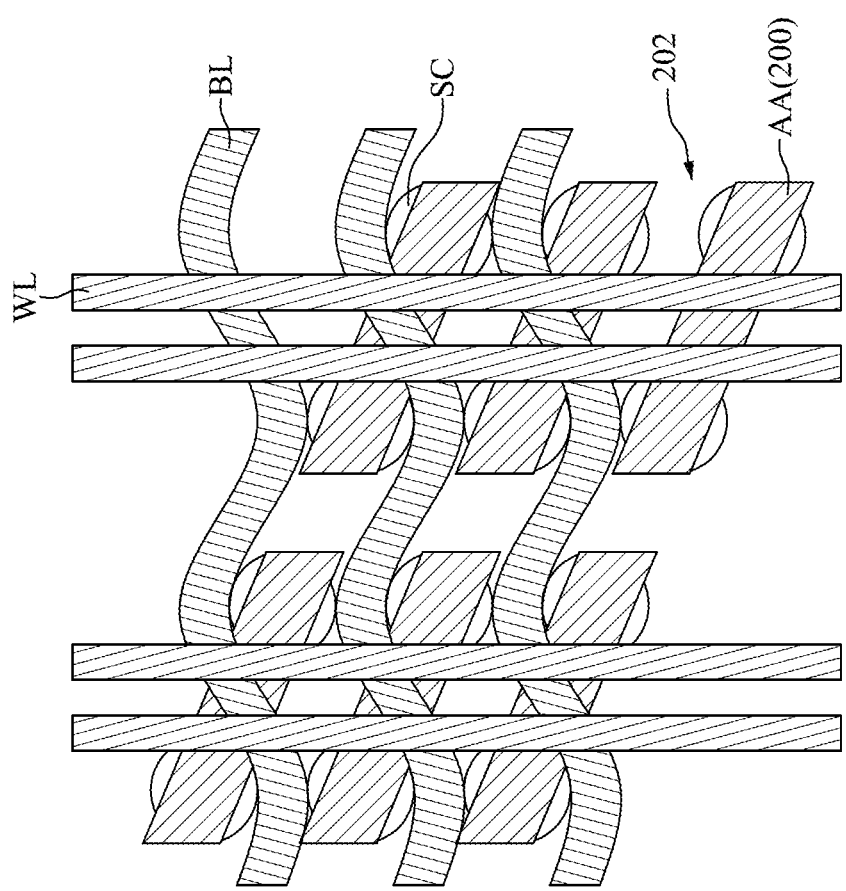
FIG. 2A is a schematic plan view illustrating a layout of a portion of the memory array, according to some embodiments of the present disclosure.

FIG. 2A is a schematic plan view illustrating a layout of a portion of the memory array structure 10, according to some embodiments of the present disclosure.

Referring to FIG. 1B and FIG. 2A, the memory array structure 10 may be built on a semiconductor substrate 200, such as a semiconductor wafer or a semiconductor-on-insulator (SOI) wafer. The semiconductor substrate 200 has surface portions laterally separated from one another and referred to as active areas AA. An isolation structure 202 extending in the semiconductor substrate 200 may laterally enclose each of the active areas AA, to physically separate and electrically isolate the active areas AA from one another. In other words, the active areas AA are defined by the isolation structure 202.

According to some embodiments, the active areas AA may be arranged as an array having multiple columns and multiple rows. The word lines WL may be formed in the semiconductor substrate 200, and each laterally penetrate through a column of the active areas AA. On the other hand, the bit lines BL may be formed over the semiconductor substrate 200, and are each intersected with a row of the active areas AA.

The access transistor AT in each memory cell 100 of the memory array structure 10 is defined in a vicinity where an active area AA is intersected with a penetrating word line WL and an intersecting bit line BL. The word line WL is functioned as a gate terminal of the access transistor AT, and portions of the active area AA at opposite sides of the word line WL may be functioned as source and drain terminals of the access transistor AT. The bit line BL is coupled to one of the source/drain terminals. In addition, the other source/drain terminal may be coupled to one of the storage capacitors SC formed above the semiconductor substrate 200. It should be noted that, the storage capacitors SC are depicted as separate patterns, which indicate separate bottom electrodes of the storage capacitors SC. Although not shown, the storage capacitors SC may actually have a common top electrode.

In some embodiments, the word lines WL extend along a first direction. In addition, the bit lines BL may extend along a second direction substantially perpendicular to the first direction. Optionally, each bit line BL may be formed with curves along its extending direction (e.g., the second direction). Further, the active areas AA may each extend along a third direction intersected with the first direction and the second direction.

In some embodiments, each active area AA is shared by two access transistors AT having a common source/drain terminal. In these embodiments, each active area AA is penetrated by two of the word lines WL, and is intersected with one of the bit lines BL. Further, each active area AA may be overlapped with two of the storage capacitors SC. The bit line BL is overlapped with and electrically connected to a portion of the active area AA spanning between the two word lines WL, and this portion of the active area AA may be functioned as the common source/drain terminal of the two access transistors AT. Other portions of the active area AA at opposite sides of the two word lines WL may be individual source/drain terminals of the two access transistors AT, and may be overlapped with and electrically connected to the two overlying storage capacitors SC, respectively.

Figure 2B:
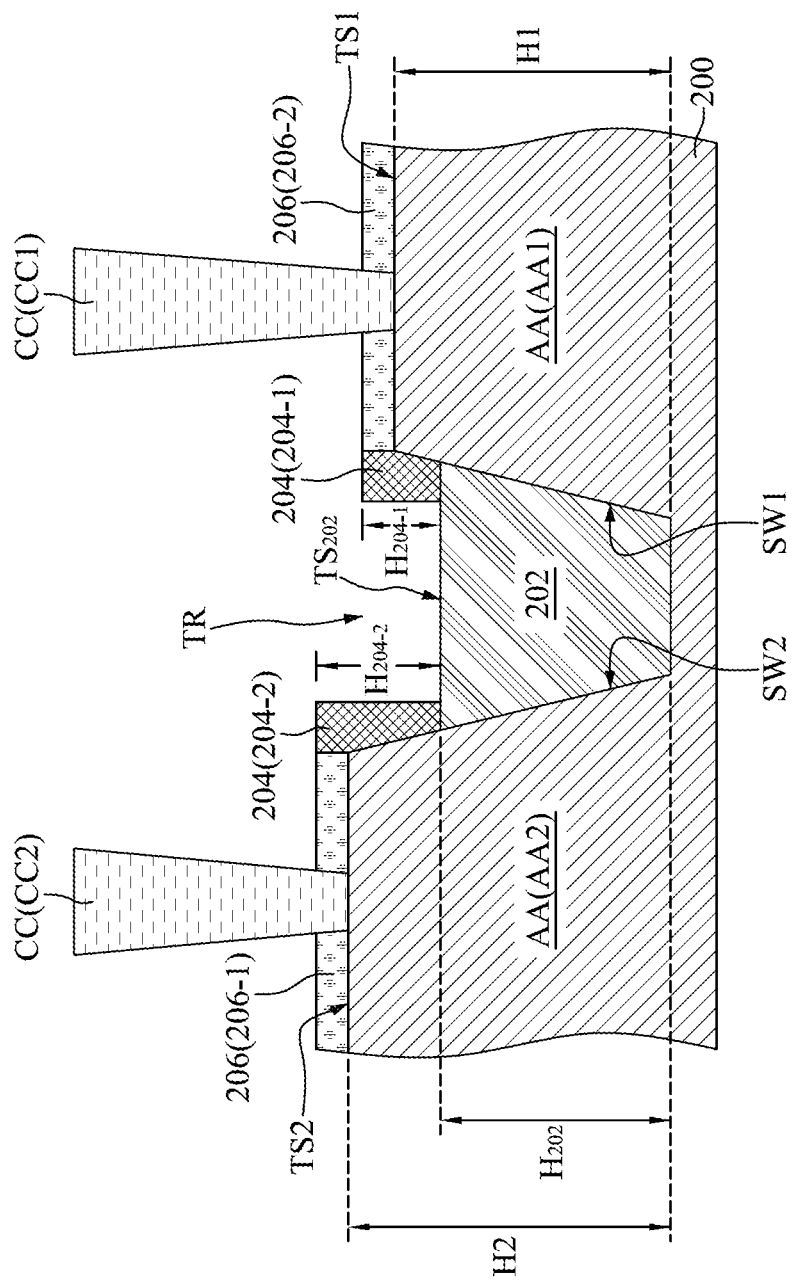
FIG. 2B is a schematic cross-sectional view illustrating edge portions of two adjacent active areas and a portion of the isolation structure extending between these adjacent active areas, according to some embodiments of the present disclosure.

FIG. 2B is a schematic cross-sectional view illustrating edge portions of two adjacent active areas AA and a portion of the isolation structure 202 extending between these adjacent active areas AA, according to some embodiments of the present disclosure.

Referring to FIG. 2B, the isolation structure 202 is formed in a trench TR extending into the semiconductor substrate 200 from a top surface of the semiconductor substrate 200, and laterally separates the active areas AA. Further, some active areas AA may be recessed with respect to other active areas AA, and the top surface of the semiconductor substrate 200 may have some regions at those recessed active areas AA lower than other regions at the unrecessed active areas AA. As an example depicted in FIG. 2B, one of the active areas AA (also referred to as an active area AA1) is recessed with respect to an adjacent active area AA (also referred to as an active area AA2). As a result, a height H1 of the active area AA1 measured from a depth leveled with a bottom end of the isolation structure 202 to a top surface TS1 of the active area AA1 is less than a height H2 of the active area AA2 measured from a depth leveled with the bottom end of the isolation structure 202 to a top surface TS2 of the active area AA2.

As a result that the active areas AA1, AA2 have different heights, the trench TR extending between the active areas AA1, AA2 may have an asymmetric shape. As an example shown in FIG. 2B that the active area AA1 is recessed with respect to the active area AA2, a sidewall SW1 of the trench TR defining a boundary of the active area AA1 may be lower than a sidewall SW2 of the trench TR defining a boundary of the active area AA2. The heights of the sidewalls SW1, SW2 are substantially equal to the heights H1, H2, respectively. To avoid redundancy, ratio and ranges of the heights H1, H2 are not repeated again.

According to some embodiments, a top surface $TS_{202}$ of the isolation structure 202 filled in the trench TR is lower than the top surface TS1 of the active area AA1, and lower than the top surface TS2 of the active area AA2. In these embodiments, a height $H_{202}$ of the isolation structure 202 measured from the bottom end of the isolation structure 202 to the top surface $TS_{202}$ of the isolation structure 202 is less than the height H1 of the active area AA1, and less than the height H2 of the active area AA2. As a result that the isolation structure 202 may not fill up the trench TR, top portions of the sidewall SW1, SW2 of the trench TR may not be covered by the isolation structure 202. Since the sidewall SW2 is taller than the sidewall SW1, the top portion of the sidewall SW2 spanning above the isolation structure 202 may be larger (taller) than the top portion of the sidewall SW1 spanning above the isolation structure 202.

In some embodiments, a top portion of each active area AA is laterally surrounded by a contact enhancement sidewall spacer 204, while rest portion of each active area AA is laterally surrounded by the isolation structure 202. The contact enhancement sidewall spacer 204 is semiconductive or conductive, and may be functioned as an extra portion of the active area AA. By having such extra portion, the active area AA may provide a larger landing area for a capacitor contact CC connecting the active area AA to an overlying storage capacitor SC (as shown in FIG. 2A). Therefore, tolerance for positioning inaccuracy of the capacitor contact CC may be increased, and great electrical contact between the capacitor contact CC and the active area AA may be ensured. As an example, the contact enhancement sidewall spacer 204 includes silicon formed by epitaxy process.

As the active area AA1 is less protruded with respect to the isolation structure 202 than the active area AA2, a contact enhancement sidewall spacer 204-1 laterally surrounding a top portion of the active area AA1 may have a height $H_{204-1}$ shorter than a height $H_{204-2}$ of a contact enhancement sidewall spacer 204-2 laterally surrounding a top portion of the active area AA2. The height $H_{204-1}$ is measured from a bottom end of the contact enhancement sidewall spacer 204-1, which may be leveled with the top surface $TS_{202}$ of the isolation structure 202, to a top end of the contact enhancement sidewall spacer 204-1. Similarly, the height $H_{204-2}$ is measured from a bottom end of the contact enhancement sidewall spacer 204-2, which may be leveled with the top surface $TS_{202}$ of the isolation structure 202, to a top end of the contact enhancement sidewall spacer 204-2. Since the contact enhancement sidewall spacers 204-1, 204-2 extend from the top surface $TS_{202}$ of the isolation structure 202 to different heights, top corners of the contact enhancement sidewall spacers 204-1, 204-2, which may have a rather large lateral thickness (not shown), can be further spaced apart along a vertical direction. Therefore, the contact enhancement sidewall spacers 204-1, 204-2 can be prevented from merging, particularly when a width of the trench TR between the active areas AA1, AA2 is further reduced. Accordingly, interference between memory cells 100 formed on adjacent active areas AA may be avoided.

In some embodiments, a top surface of each active area AA is covered by a self-assembly monolayer (SAM) 206. The SAM 206 may be selectively formed on the top surface of each active area AA, and may not extend to a sidewall of each active area AA. That is, a top portion of a sidewall of each active area AA spanning above the isolation structure 202 may not be covered by the SAM 206. Accordingly, the contact enhancement sidewall spacer 204 formed after the SAM 206 can be disposed on the top portion of the sidewall of the active area AA. According to some embodiments, the contact enhancement sidewall spacer 204 may further extend to a sidewall of the SAM 206. In these embodiments, a top end of the contact enhancement sidewall spacer 204 may be substantially leveled with a top surface of the SAM 206.

Since the active area AA1 is recessed with respect to the active area AA2, the top surface TS1 of the active area AA1 is lower than the top surface TS2 of the active area AA2. Accordingly, the SAM 206 covering the top surface TS1 of the active area AA1 (also referred to as a SAM 206-1) is lower than the SAM 206 covering the top surface TS2 of the active area AA2 (also referred to as a SAM 206-2).

Self-assembled monolayers (SAMs) are known in the art. See, for example, "Reactive Monolayers in Directed Additive Manufacturing—Area Selective Atomic Layer Deposition" Rudy J. Wojtecki et al., Journal of Photopolymer Science and Technology, 2018 Volume 31 Issue 3 Pages 431-436, which is incorporated herein by reference. In some embodiments, the SAMs 206 comprises organic molecules. According to some embodiments, the SAMs 206 comprises a plurality of molecules having a chemical formula selected from the group consisting of X-R1-SH, X-R1-S-S-R2-Y, R1-S-R2, and combinations thereof, wherein R1 and R2 are independently a carbon chain or a carbon chain interrupted by at least one heteroatom, wherein H is hydrogen, wherein S is sulfur, and wherein X and Y are chemical groups that essentially do not chemically react with the copper surface. In some embodiments, at least one of R1 and R2 is a chain of n carbon atoms, wherein n is an integer of from 1 to 30. In some embodiments, the SAMs 206 has a chemical formula $SH(CH_2)_9CH_3$.

In some embodiments, the SAM is a layer formed by self-assembly of a polymerizable compound. The monolayer has a thickness corresponding to the length of one molecule of the compound in the close-packed structure of the monolayer. The close packing is assisted by a functional group of the compound that binds to surface groups of the substrate by electrostatic interactions and/or one or more covalent bonds. The portion of the compound that binds to the substrate surface is referred to herein as the "head" of the compound. The remainder of the compound is referred to as the "tail". The tail extends from the head of the compound to the atmosphere interface at the top surface of the SAM. The tail has a non-polar peripheral end group at the atmosphere interface. For this reason, a well-formed SAM having few defects in its close packed structure can displays high contact angles.

The head of the SAM-forming compound can selectively bind to a portion of a substrate top surface that comprises regions of different compositions, leaving other portions of the substrate top surface having none of, or substantially none of, the SAM-forming compound disposed thereon. In this instance, a patterned initial SAM can be formed in one step by immersing the substrate in a solution of the given SAM-forming compound dissolved in a suitable solvent. In some embodiments, ultraviolet radiation can have a wavelength from about 4 nm to 450 nm. Deep ultraviolet (DUV) radiation can have a wavelength from 124 nm to 300 nm. Extreme ultraviolet (EUV) radiation can have a wavelength from about 4 nm to less than 124 nm.

In those embodiments where each active area AA is covered by the SAM 206, the capacitor contacts CC disposed on the active area AA may penetrate through the SAM 206, in order to establish electrical contact with the active area AA. Similarly, other contacts (e.g., bit line contacts (not shown)) may extend through the SAM 206 to reach the active area AA as well. Further, in some embodiments, the capacitor contacts CC extending to the rather lower active areas AA may be taller than the capacitor contacts CC extending to the rather higher active areas AA. As an example shown in FIG. 2B, the capacitor contact CC extending to the active area AA1 (also referred to as a capacitor contact CC1) may be taller than the capacitor contact CC extending to the active area AA2 (also referred to as a capacitor contact CC2).

As described above, the active areas AA of the memory cells 100 in the memory array structure 10 have extra portions (i.e., the contact enhancement sidewall spacers 204) at their top corners. By further having these extra portions, the active areas AA may provide larger landing areas for the capacitor contacts CC standing on the active areas AA. Therefore, electrical contact between the capacitor contacts CC and the active areas AA may be less affected by variations of a process for positioning the capacitor contacts CC (e.g., lithography overlay issue). In other words, the electrical contact between the capacitor contacts CC and the active areas AA can be improved. Furthermore, adjacent active areas AA are designed as having different heights, and a top surface of an active area AA may be recessed with respect to a top surface of an adjacent active area AA. Consequently, the extra portions of adjacent active areas AA, which are formed at the top corners of the active areas AA, can be further spaced apart along a vertical direction. As a result, adjacent active areas AA may be prevented from merging together, thus interference between memory cells 100 formed on adjacent active areas AA may be avoided.

Figure 3:
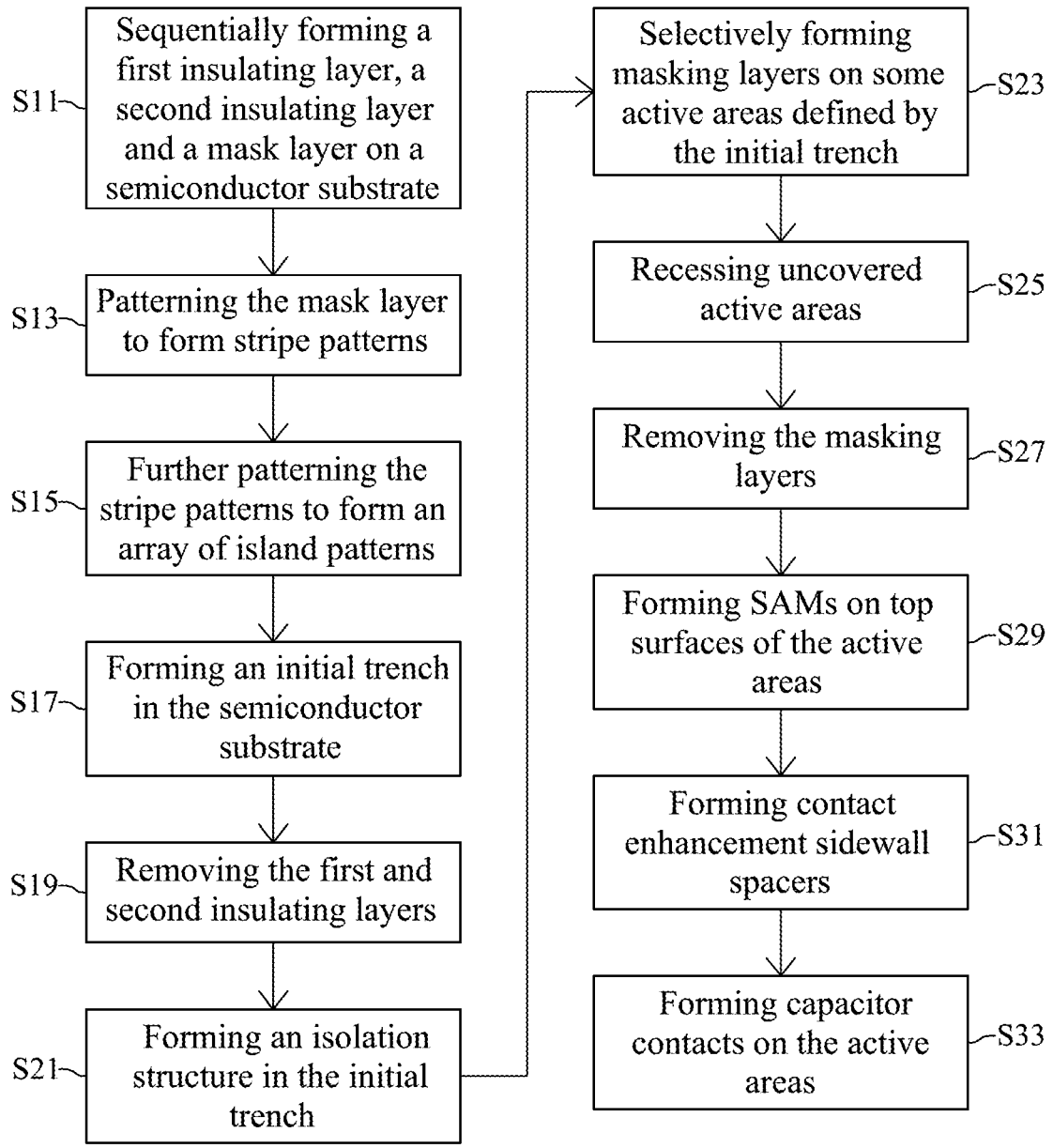
FIG. 3 is a flow diagram illustrating a method for preparing the structure as shown in FIG. 2B, according to some embodiments of the present disclosure.

FIG. 3 is a flow diagram illustrating a method for preparing the structure as shown in FIG. 2B, according to some embodiments of the present disclosure. FIG. 4A through FIG. 4K are schematic plan views illustrating structures at intermediate stages during the manufacturing process shown in FIG. 3. FIG. 5A through FIG. 5K are schematic cross-sectional views illustrating structures at intermediate stages during the manufacturing process shown in FIG. 3. Particularly, FIG. 5B is a schematic cross-sectional view along a line A-A' shown in FIG. 4B, while FIG. 5C through FIG. 5K are schematic cross-sectional views along a line B-B' shown in FIG. 4C through FIG. 4K.

Figure 4A:
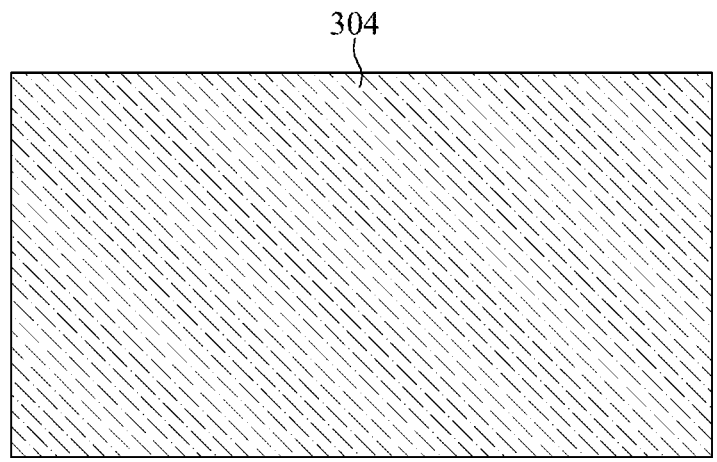
FIG. 4A through FIG. 4K are schematic plan views illustrating structures at intermediate stages during the manufacturing process shown in FIG. 3.
Figure 5A:
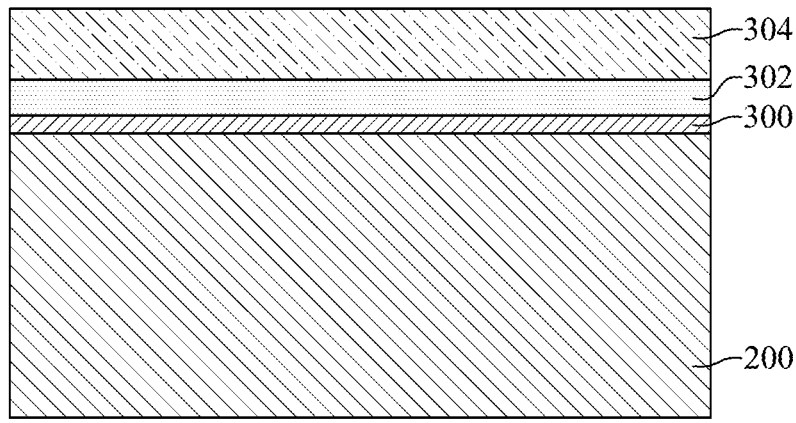
FIG. 5A through FIG. 5K are schematic cross-sectional views illustrating structures at intermediate stages during the manufacturing process shown in FIG. 3.
Figure 5B:
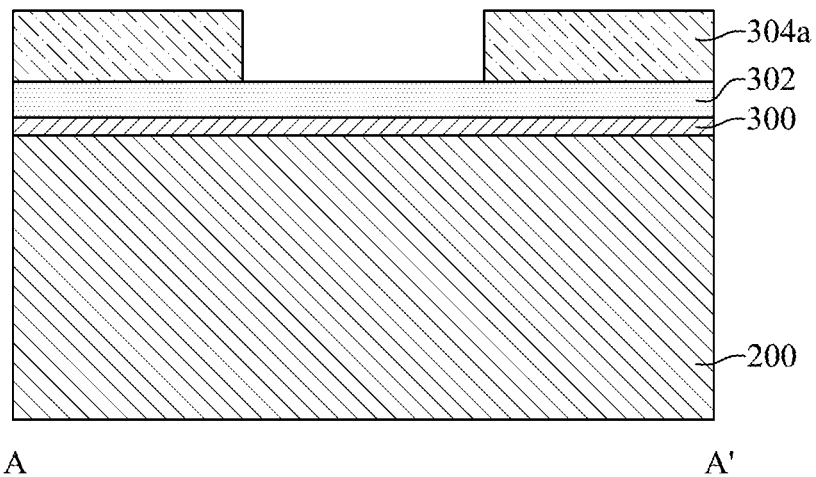

Referring to FIG. 3, FIG. 4A and FIG. 5A, step 11 is performed, and a first insulating layer 300, a second insulating layer 302 and a mask layer 304 are sequentially formed on the semiconductor substrate 200. According to some embodiments, the first insulating layer 300 is formed of silicon oxide, while the second insulating layer 302 is formed of silicon nitride. In these embodiments, the first insulating layer 300 may be formed by a thermal oxidation process or a deposition process (e.g., a chemical vapor deposition (CVD) process), and the second insulating layer 302 may be formed of a deposition process (e.g., a CVD process). Further, in some embodiments, the mask layer 304 is a photoresist layer, and may be coated onto the semiconductor substrate 200. In alternative embodiments, the mask layer 304 is a hard mask layer, and may be formed by a deposition process (e.g., a CVD process).

Figure 4B:
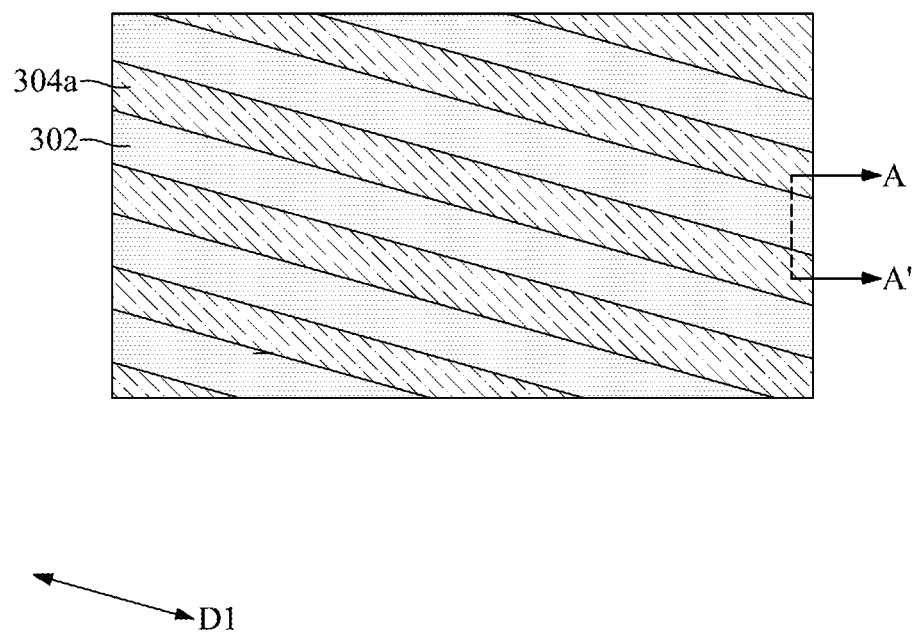

Referring to FIG. 3, FIG. 4B and FIG. 5B, step S13 is performed, and the mask layer 304 is patterned to form stripe patterns 304a. The stripe patterns 304a may extend along a direction D1, which may be aligned with a direction along which each row of the active areas AA shown in FIG. 2A extend. By partially removing the mask layer 304 to form the stripe patterns 304a, portions of the second insulating layer 302 between the strips 304a may be currently exposed. In some embodiments, the mask layer 304 is a photoresist layer, and a method for patterning the mask layer 304 to form the stripe patterns 304a may include a lithography process. In alternative embodiments, the mask layer 304 is a hard mask layer, and a method for patterning the mask layer 304 to form the stripe patterns 304a may include a lithography process and an etching process.

Figure 4C:
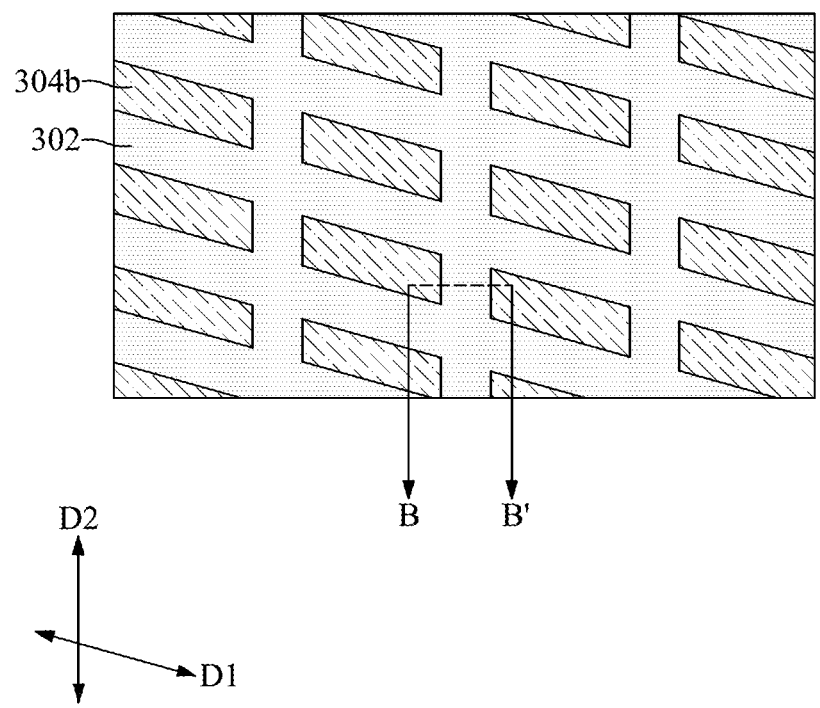
Figure 5C:
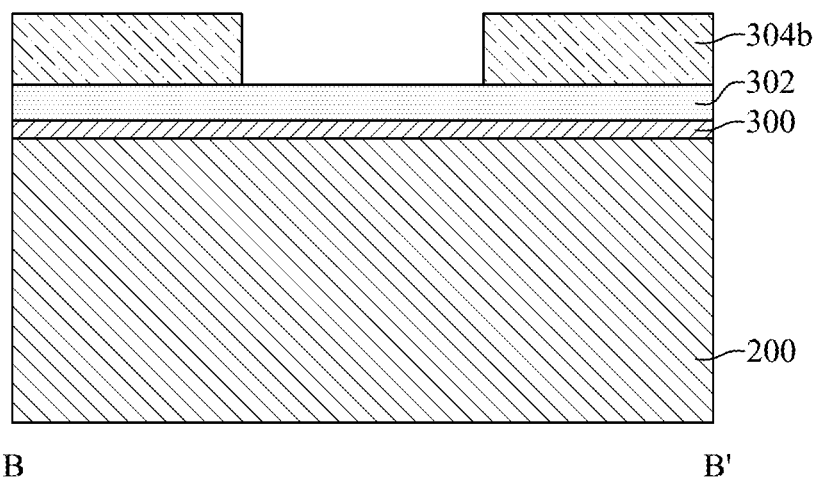

Referring to FIG. 3, FIG. 4C and FIG. 5C, step S15 is performed, and the stripe patterns 304a are further patterned to form an array of island patterns 304b. The island patterns 304b in each row may be arranged along a direction D1, while the island patterns 304b in each column may be arranged along a direction D2 intersected with the direction D1. The island patterns 304b will be functioned as shadow masks during formation of an initial trench TR' in a subsequent step. The island patterns 304b in each row are portions of the same stripe pattern 304a, and may be laterally spaced apart from one another along the direction D1. By partially removing the stripe patterns 304a to form the island patterns 304b, portions of the second insulating layer 302 between the island patterns 304b may be currently exposed. In some embodiments, the mask layer 304 is a photoresist layer, and a method for patterning the stripe patterns 304a to form the island patterns 304b includes a lithography process. In alternative embodiments, the mask layer 304 is a hard mask layer, and a method for patterning the stripe patterns 304a to form the island patterns 304b includes a lithography process and an etching process.

As described above, in some embodiments, two patterning steps are used for forming the island patterns 304b. In an alternative embodiments, a single patterning process may be used for patterning the mask layer 304 as shown in FIG. 4A and FIG. 5A into the island patterns 304b as shown in FIG. 4C and FIG. 5C.

Figure 4D:
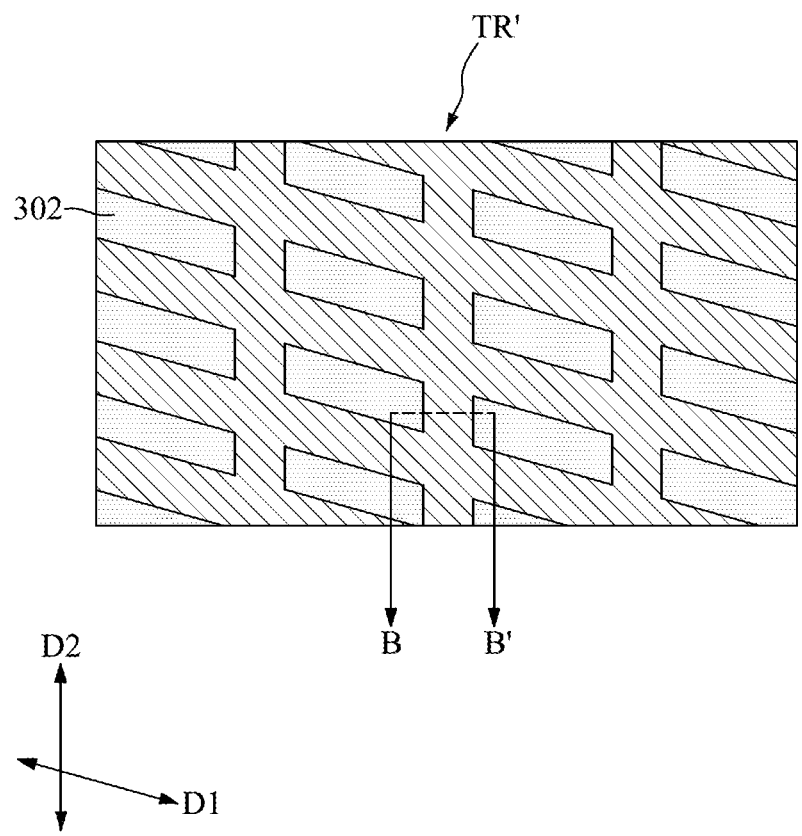
Figure 5D:
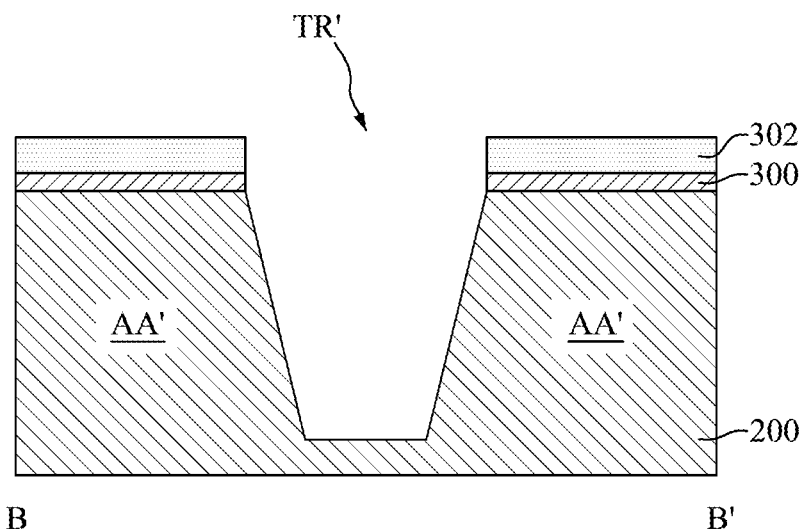

Referring to FIG. 3, FIG. 4D and FIG. 5D, step S17 is performed, and an initial trench TR' is formed in the semiconductor substrate 200. The initial trench TR' may penetrate through portions of the first and second insulating layers 300, 302 spanning between the island patterns 304b, and further extend into the semiconductor substrate 200. By forming the initial trench TR', surface portions of the semiconductor substrate 200 are laterally separated from one another, and are referred to as initial active areas AA'. Top surfaces of the initial active areas AA' may be substantially coplanar with one another. According to some embodiments, an etching process is used for forming the initial trench TR'. During the etching process, the island patterns 304b may be functioned as shadow masks. Further, the island patterns 304b may be removed after the etching process, and the second insulating layer 302 lying below may be exposed.

Figure 4E:
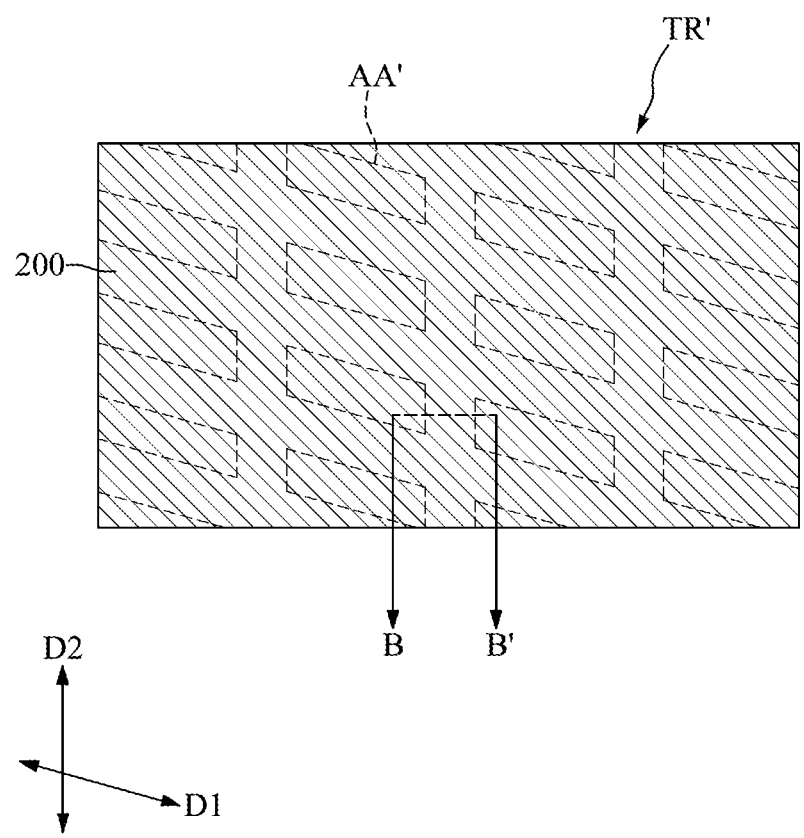
Figure 5E:
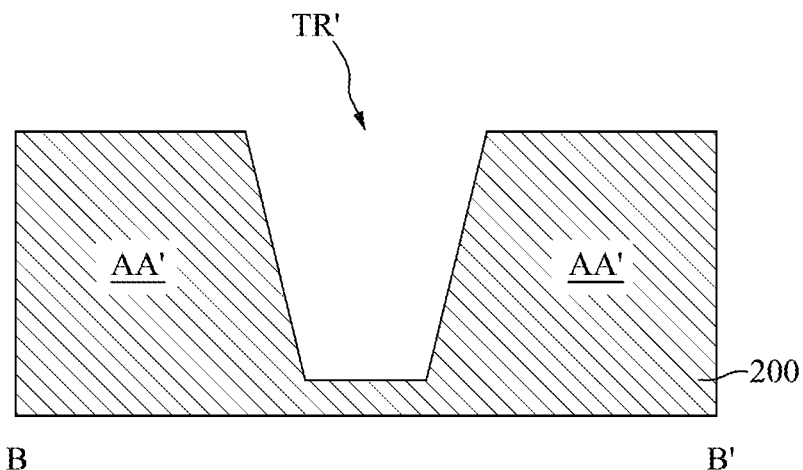

Referring to FIG. 3, FIG. 4E and FIG. 5E, step S19 is performed, and the first and second insulating layers 300, 302 are removed. As a result, the top surfaces of the initial active areas AA' may be exposed. In some embodiments, a method for removing the first and second insulating layers 300, 302 includes an etching process.

Figure 4F:
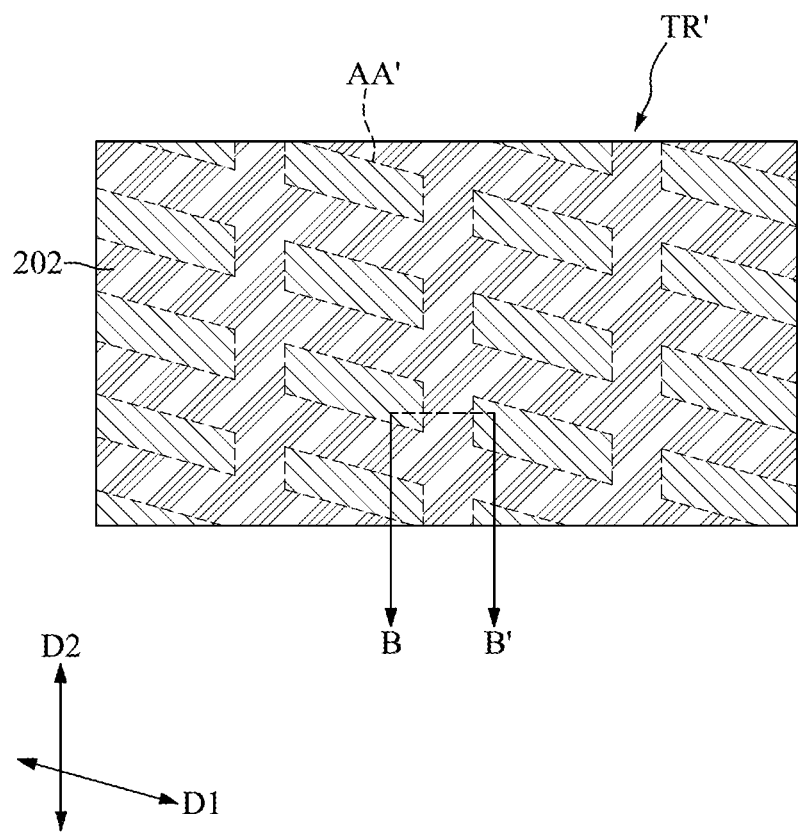
Figure 5F:
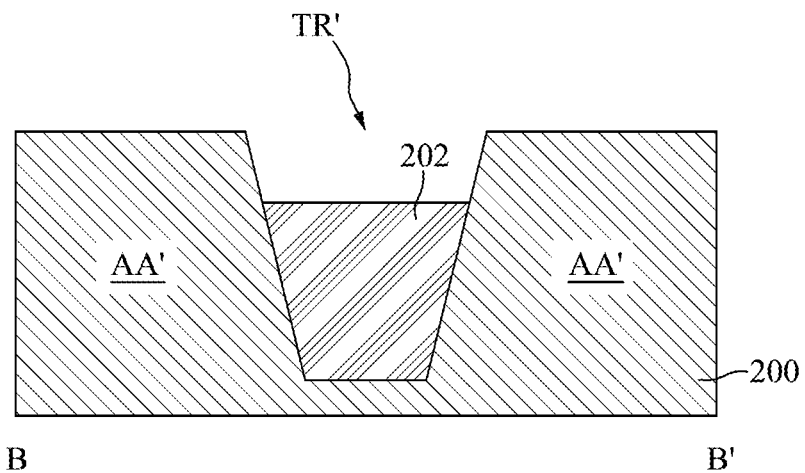

Referring to FIG. 3, FIG. 4F and FIG. 5F, step S21 is performed, and the isolation structure 202 is formed in the initial trench TR'. In some embodiments, a method for preparing the isolation structure 202 includes providing an insulating material on the structure as shown in FIG. 4E and FIG. 5E. The insulating material may fill up the initial trench TR', and cover the top surfaces of the initial active areas AA'. Subsequently, portions of the insulating material spanning over the top surfaces of the active areas AA may be removed by a planarization process, such as a polishing process, and by etching process or a combination thereof. Further, portions of the insulating material filled in the initial trench TR' may be recessed with respect to the top surfaces of the initial active areas AA', and the remained insulating material may form the isolation structure 202. As an example, a method for recessing the portions of the insulating material in the initial trench TR' may include an etching process.

Figure 4G:
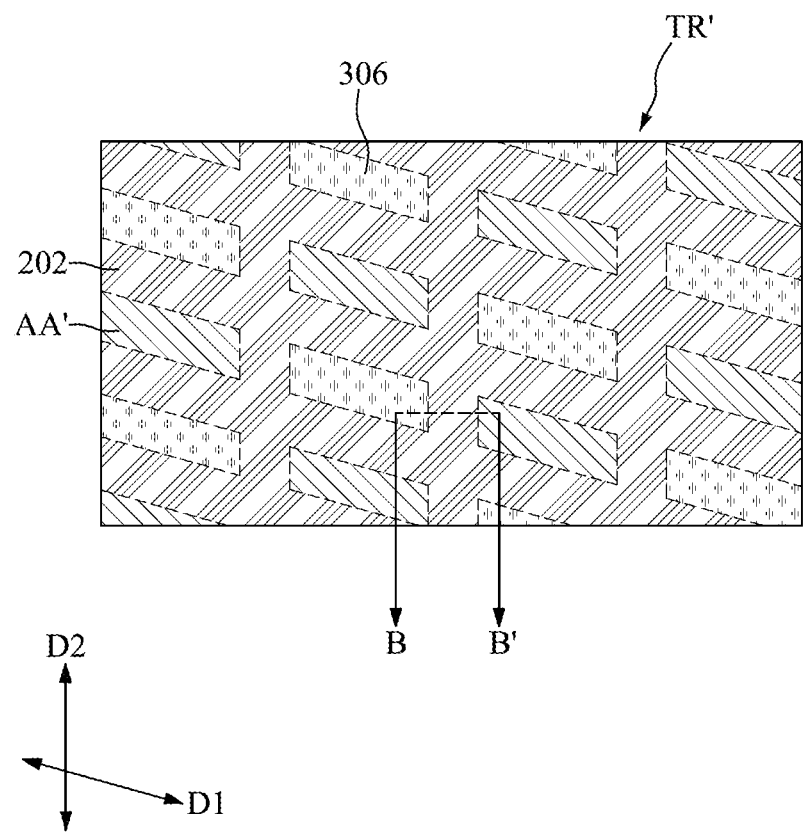
Figure 5G:
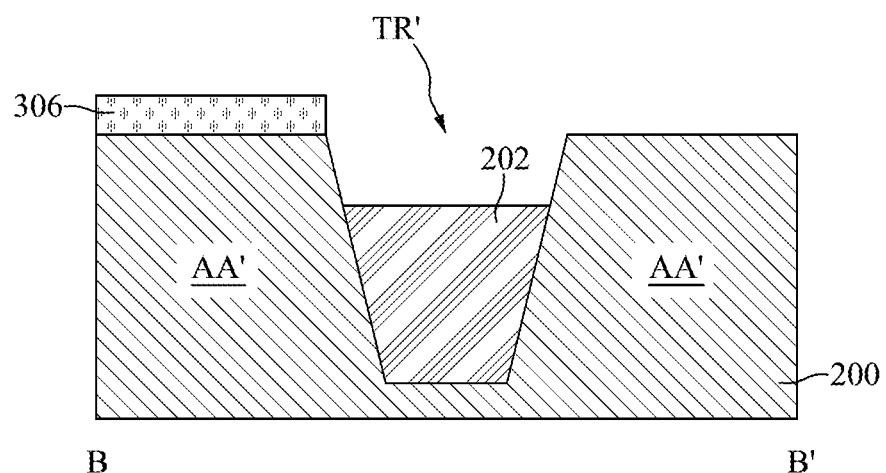

Referring to FIG. 3, FIG. 4G and FIG. 5G, step S23 is performed, and masking layers 306 are selectively formed on some of the initial active areas AA'. As a result, as shown in FIG. 5G, one of adjacent initial active areas AA' is covered by a masking layer 306, while the other may be remained exposed. According to some embodiments, the initial active areas AA' in each row are alternately covered along the row direction (e.g., the direction D1). In these embodiments, the masking layers 306 are periodically arranged along the row direction (e.g., the direction D1). As an example, a method for preparing the masking layers 306 may include forming a globally spanning material layer, and patterning the material layer to form the masking layers 306 by a lithography process and an etching process. The masking layers 306 are formed of a material having sufficient etching selectivity with respect to the semiconductor substrate 200.

Figure 4H:
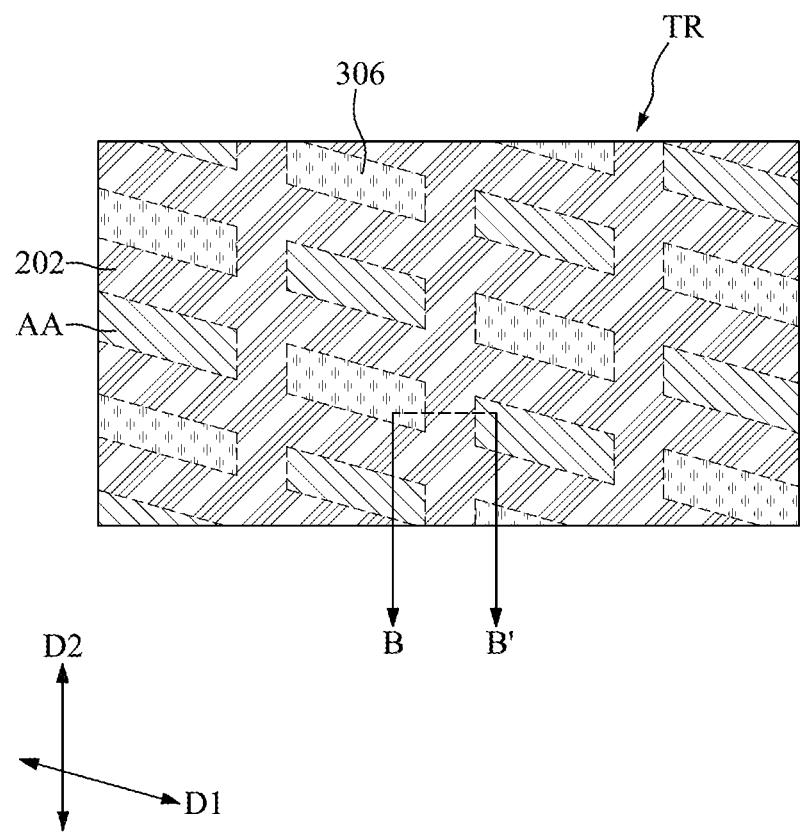
Figure 5H:
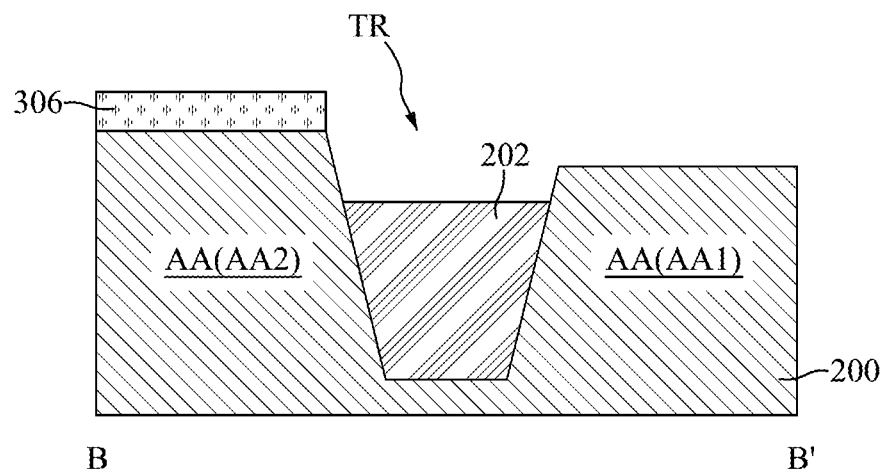

Referring to FIG. 3, FIG. 4H and FIG. 5H, step S25 is performed, and the uncovered initial active areas AA' are recessed with respect to the initial active areas AA' covered by the masking layers 306. As a result, the initial active areas AA' are selectively recessed, and form the active areas AA as described with reference to FIG. 2B. As shown in FIG. 5H, the active area AA1 is one of the recessed active areas AA, while the active area AA2 is one of the unrecessed active areas AA. Further, during the recessing step, the initial trench TR' is shaped to be the trench TR that has a sidewall taller than the other sidewall, as described with reference to FIG. 2B. In some embodiments, a method for selectively recessing the initial active areas AA' includes an etching process. In these embodiments, the masking layers 306 and the isolation structure 202 have sufficient etching selectivity with respect to the semiconductor substrate 200, such that the masking layers 306 and the isolation structure 202 may be barely consumed during the etching process targeting the semiconductor substrate 200.

Figure 4I:
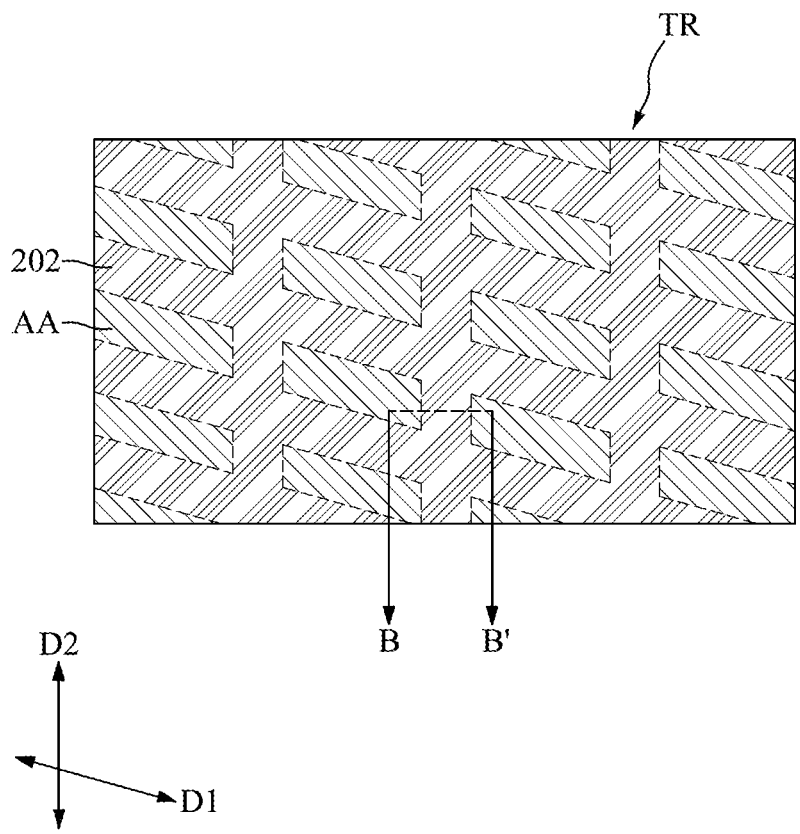
Figure 5I:
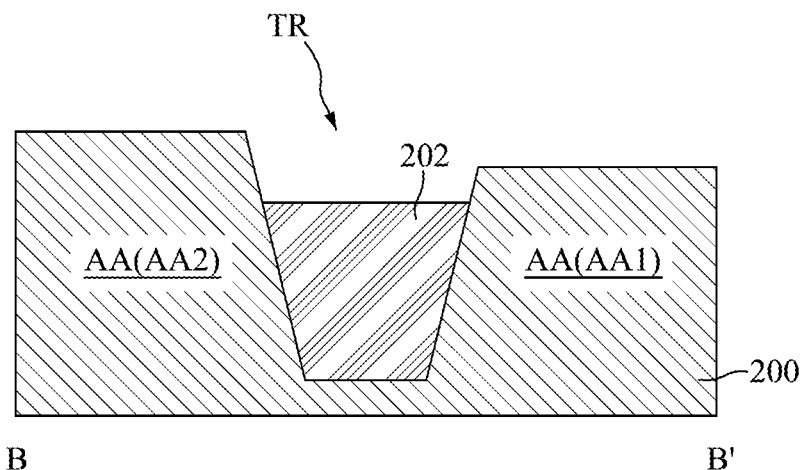

Referring to FIG. 3, FIG. 4I and FIG. 5I, step S27 is performed, and the masking layers 306 are removed. As removal of the masking layers 306, the previously covered active areas AA may be currently exposed. For instance, as shown in FIG. 5I, the active areas AA1, AA2 may be both exposed in the current step. According to some embodiments, a method for preparing the masking layers 306 includes an etching process. Since the masking layers 306 have sufficient etching selectivity with respect to the isolation structure 202 and the semiconductor substrate 200, the isolation structure 202 and the active areas AA may be barely recessed during the etching process.

Figure 4J:
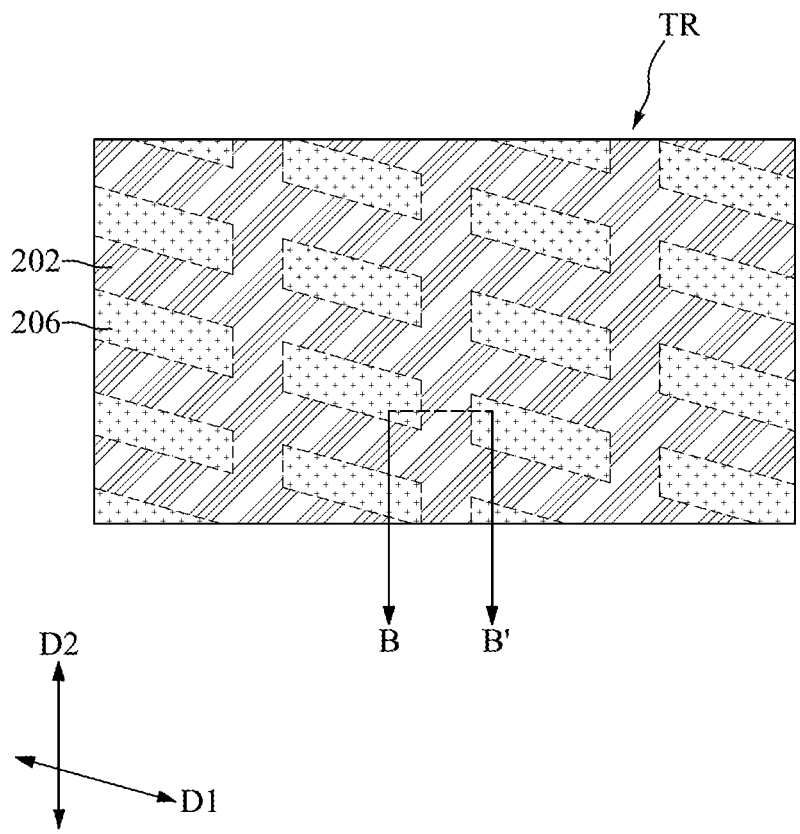
Figure 5J:
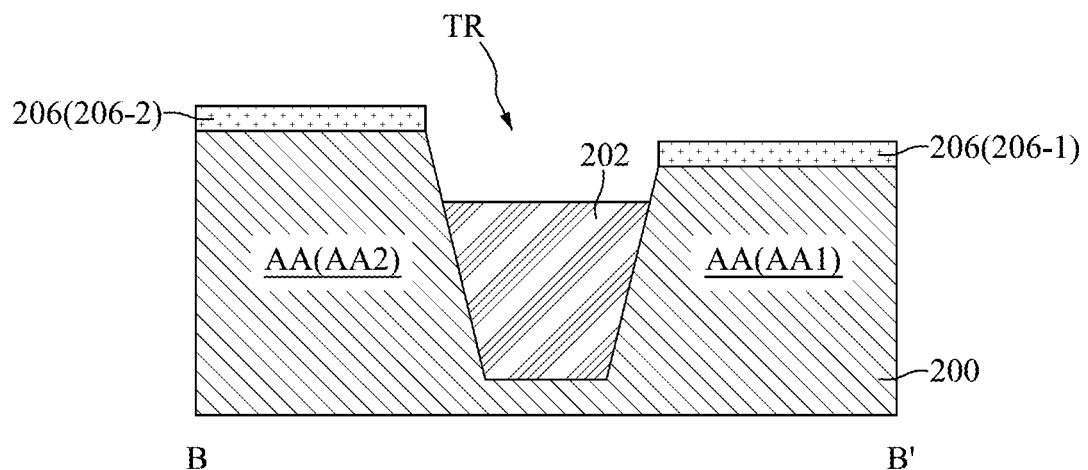

Referring to FIG. 3, FIG. 4J and FIG. 5J, step S29 is performed, and the SAMs 206 are formed on the top surfaces of the active areas AA. According to some embodiments, the SAMs 206 are selectively adsorbed to the top surfaces of the active areas AA, and top portions of the sidewalls of the trench TR' may remained uncovered.

In some embodiments, The SAM-forming compound can be dissolved or dispersed in the solvent. The compositions are suitable for forming a SAM layer comprising the SAM-forming compound. Exemplary solvents include, but are not limited to: toluene, xylene, dichloromethane (DCM), chloroform, carbon tetrachloride, ethyl acetate, butyl acetate, amyl acetate, propylene glycol monomethyl ether acetate (PGMEA), propylene glycol monomethyl ether (PGME), ethoxyethyl propionate, anisole, ethyl lactate, diethyl ether, dioxane, tetrahydrofuran (THF), acetonitrile, acetic acid, amyl acetate, n-butyl acetate, γ-butyrolactone (GBL), acetone, methyl isobutyl ketone, 2-heptanone, cyclohexanone, methanol, ethanol, 2-ethoxyethanol, 2-butoxyethanol, iso-propyl alcohol, n-butanol, N,N-dimethylformamide (DMF), N,N-dimethylacetamide, pyridine, and dimethylsulfoxide (DMSO). The solvents can be used singularly or in combination.

In some embodiments, the solution can be applied to a top surface of a substrate using any suitable coating technique (e.g., dip-coating, spin coating) followed by removal of the solvent, thereby forming an initial SAM layer. The SAM layer has a top surface in contact with an atmosphere and a bottom surface in contact a selected surface of the substrate to which the SAM-forming compound has preferential affinity. In general, the SAM can have a thickness of about 0.5 to about 20 nanometers, more particularly about 0.5 to about 10 nanometers, and even more particularly about 0.5 to about 2 nanometers.

Figure 4K:
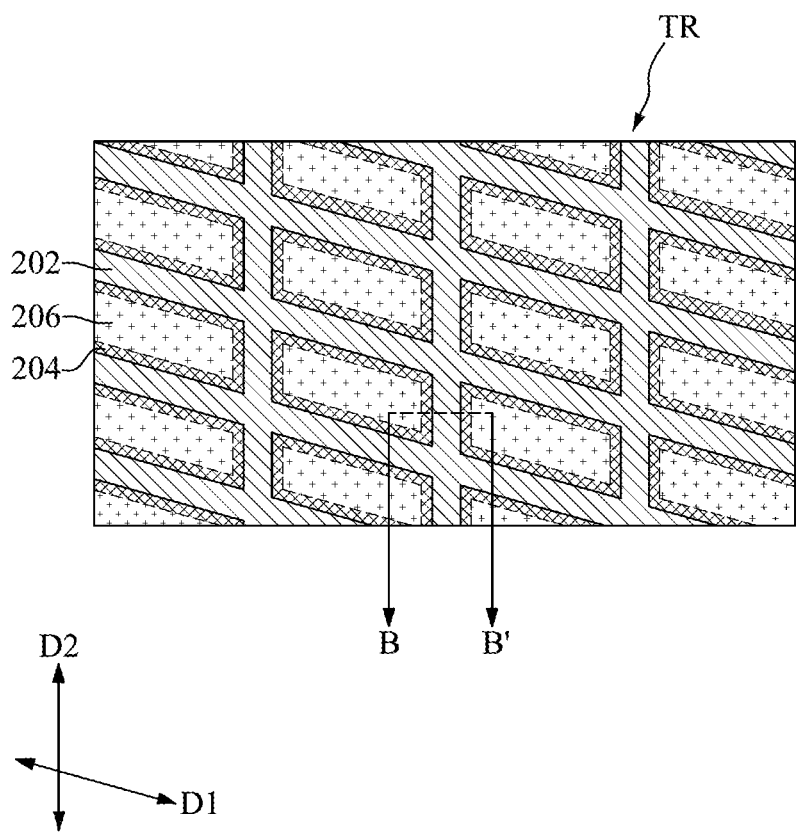
Figure 5K:
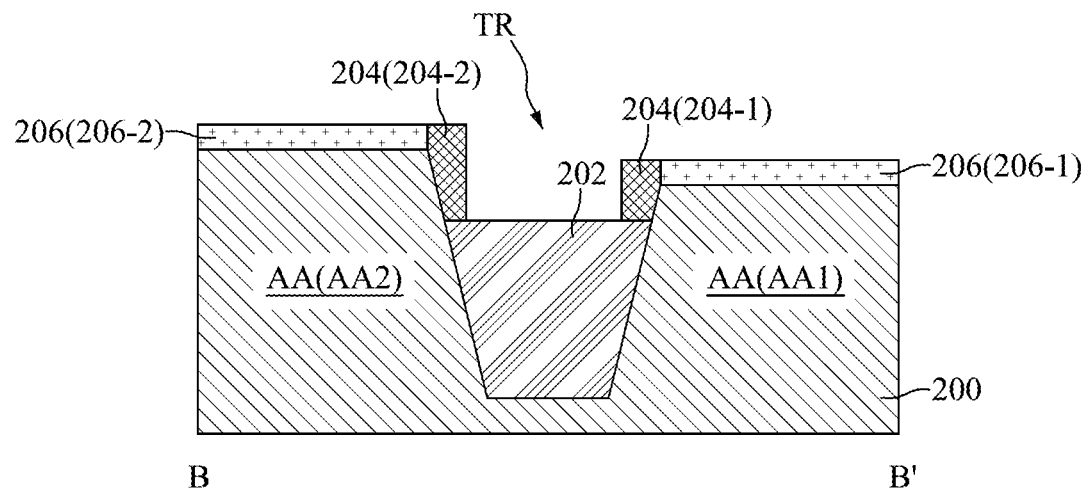

Referring to FIG. 3, FIG. 4K and FIG. 5K, step S31 is performed, and the contact enhancement sidewall spacers 204 are formed. According to some embodiments, the contact enhancement sidewall spacers 204 are formed by an epitaxial process. During the epitaxial process, the material of the contact enhancement sidewall spacers 204 may grow from exposed portions of the active areas AA, which are top portions of the sidewalls of the active areas AA extending between the SAMs 206 and the isolation structure 202. In certain cases, the contact enhancement sidewall spacers 204 may further extend to sidewalls of the SAMs 206. By forming the contact enhancement sidewall spacers 204, the top portions of the active areas AA are laterally surrounded with extra portions, as described with reference to FIG. 2A.

Referring to FIG. 3 and FIG. 2B, step S33 is performed, and the capacitor contacts CC are formed on the active areas AA. Although not shown, several process steps may be performed before formation of the capacitor contacts CC. As an example, a dielectric layer (not shown) may be globally formed on the active areas AA and the isolation structure 202 before formation of the capacitor contacts CC. In addition, through holes may be formed in this dielectric layer by a lithography process and an etching process for defining locations of the capacitor contacts CC. Subsequently, a conductive material may be filled in these through holes by a deposition process, a plating process or a combination thereof, and excess portions of the conductive material over the dielectric layer may be removed by a planarization process. The remained portions of the conductive material in the through holes may form the capacitor contacts CC.

Up to here, the structure as shown in FIG. 2B has been formed. Although not shown, additional process steps may be performed for forming other components of the memory array structure 10 (as described with reference to FIG. 1B and FIG. 2A), including the word lines WL, the bit lines BL and the storage capacitors SC. These additional process steps may be performed among and after the process steps as described with reference to FIG. 3, FIG. 4A through FIG. 4K, FIG. 5A through FIG. 5K and FIG. 2B.

Figure 6:
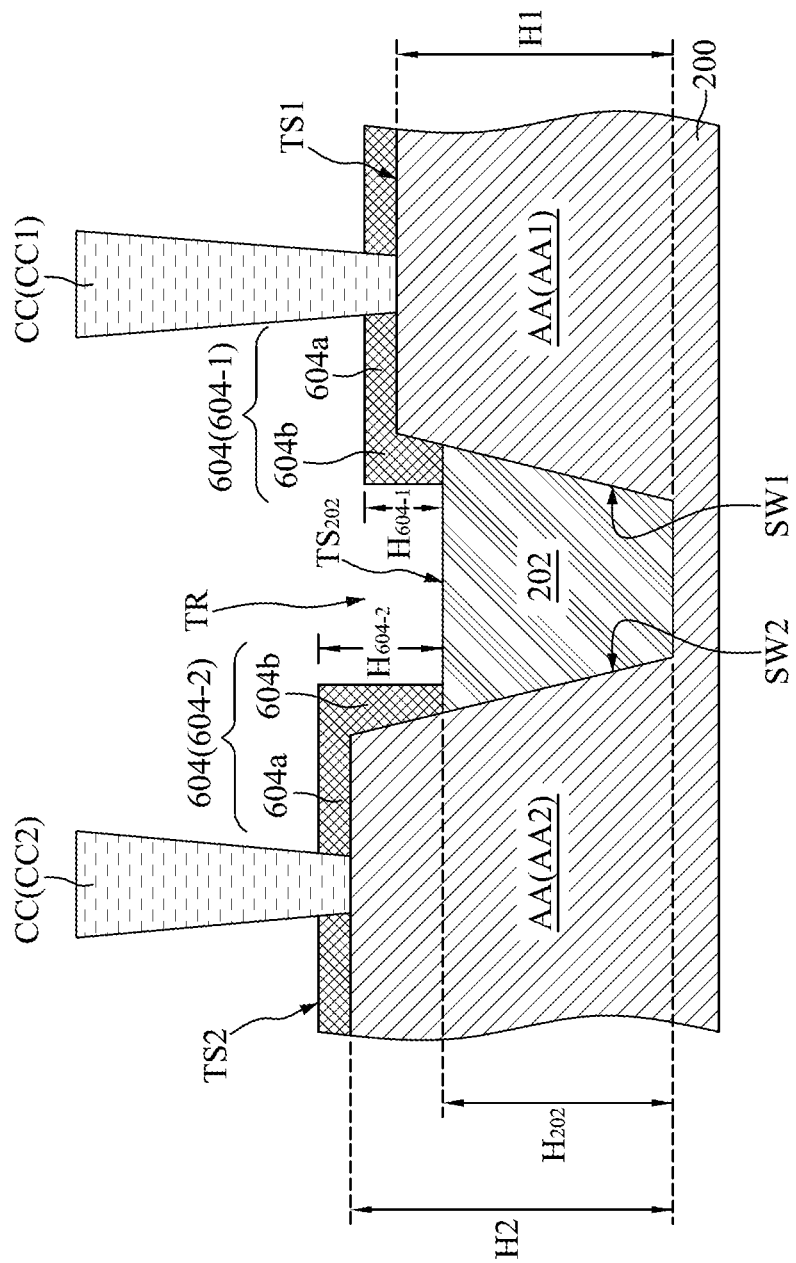
FIG. 6 is a schematic cross-sectional view illustrating edge portions of two adjacent active areas and a portion of the isolation structure extending between these adjacent active areas, according to some other embodiments of the present disclosure.

FIG. 6 is a schematic cross-sectional view illustrating edge portions of two adjacent active areas AA and a portion of the isolation structure 202 extending between these adjacent active areas AA, according to some other embodiments of the present disclosure.

Referring to FIG. 6, in some embodiments, the SAMs 206 as described with reference to FIG. 2B are omitted. In these embodiments, a top portion of each active area AA is covered by a contact enhancement cap 604. The contact enhancement cap 604 is similar with the contact enhancement sidewall spacer 204 (as described with reference to FIG. 2B) in terms of material selection and function. In other words, the contact enhancement cap 604 is semiconductive or conductive, and may be functioned as an extra portion of the active area AA, for improving electrical contact between the active area AA and the capacitor contacts CC standing on the active area AA. In some embodiments, the contact enhancement cap 604 includes a contact enhancement layer 604a lying on a top surface of the active area AA, and includes a contact enhancement sidewall spacer 604b laterally surrounding the top portion of the active area AA. The contact enhancement sidewall spacer 604b may extend from the contact enhancement layer 604a to a top surface of the isolation structure 202 along a sidewall of the active area AA, and provides an additional landing area for the capacitor contacts CC providing on the active area AA. In some embodiments, the capacitor contacts CC penetrate through the contact enhancement layer 604a to establish electrical contact with the active area AA.

As described above, some of the active areas AA (e.g., the active area AA1) are less protruded with respect to the isolation structure 202 than other active areas AA (e.g., the active area AA2). As a result, the contact enhancement caps 604 covering the less protruded active areas AA (referred to as contact enhancement caps 604-1) are lower than the contact enhancement caps 604 covering the more protruded active areas AA (referred to as contact enhancement caps 604-2). In other words, the contact enhancement layers 604a of the contact enhancement caps 604-1 may extend on a plane lower than a plane on which the contact enhancement layers 604a of the contact enhancement caps 604-2 extend. In addition, the contact enhancement sidewall spacers 604b of the contact enhancement caps 604-1 may have a height $H_{604-1}$ shorter than a height $H_{604-2}$ of the contact enhancement sidewall spacers 604b of the contact enhancement caps 604-2. The height $H_{604-1}$ is measured from a bottom end of the contact enhancement sidewall spacer 604b of the contact enhancement cap 604-1, which may be leveled with the top surface $TS_{202}$ of the isolation structure 202, to a top end of this contact enhancement sidewall spacer 604b. Similarly, the height $H_{604-2}$ is measured from a bottom end of the contact enhancement sidewall spacer 604b of the contact enhancement cap 604-2, which may be leveled with the top surface $TS_{202}$ of the isolation structure 202, to a top end of this contact enhancement sidewall spacer 604b. As a result that the contact enhancement caps 604-1 are lower than the contact enhancement caps 604-2, top corners of the contact enhancement caps 604-1, 604-2 can be further spaced apart along a vertical direction, thus the contact enhancement caps 604-1, 604-2 can be prevented from merging when a width of the trench TR between adjacent active areas AA is greatly reduced. Accordingly, interference between memory cells 100 formed on adjacent active areas AA may be avoided.

In regarding manufacturing of the structure as shown in FIG. 6, the step of forming the SAMs 206 (as described with reference to FIG. 4J and FIG. 5J) may be omitted. In addition, after the active areas AA1 are recessed and the masking layers 306 are removed (as described with reference to FIGS. 4H-4I and FIGS. 5H-5I), the contact enhancement caps 604 are formed on the active areas AA by, for example, an epitaxial process. Further, the capacitor contacts CC may be formed on the active areas AA.

As above, the active areas of the memory cells in the memory array structure have extra portions (i.e., the contact enhancement sidewall spacers) at their top corners. By further having these extra portions, the active areas may provide larger landing areas for the capacitor contacts standing on the active areas. Therefore, electrical contact between the capacitor contacts and the active areas may be less affected by variations of a process for positioning the capacitor contacts. In other words, the electrical contact between the capacitor contacts and the active areas can be improved. Furthermore, adjacent active areas are designed as having different heights, and a top surface of an active area may be recessed with respect to a top surface of an adjacent active area. Consequently, the extra portions of adjacent active areas can be further spaced apart along a vertical direction. As a result, adjacent active areas may be prevented from merging together, thus interference between memory cells formed on adjacent active areas may be avoided.

In an aspect of the present disclosure, a memory array structure is provided. The memory array structure comprises: a semiconductor substrate, with a trench defining laterally separate active areas formed of surface regions of the semiconductor substrate, wherein top surfaces of a first group of the active areas are recessed with respect to top surfaces of a second group of the active areas; an isolation structure, filled in the trench and in lateral contact with bottom portions of the active areas; and contact enhancement sidewall spacers, laterally surrounding top portions of the active areas, respectively.

In another aspect of the present disclosure, a memory array structure is provided. The memory array structure comprises: active areas, formed of laterally separate surface portions of a semiconductor substrate, wherein top surfaces of a first group of the active areas are recessed with respect to top surfaces of a second group of the active areas; an isolation structure, extending between the active areas, and in contact with bottom portions of the active areas; and contact enhancement caps, capping top portions of the active areas, respectively.

In yet another aspect of the present disclosure, a method for preparing a memory array structure is provided. The method includes: forming a trench at a front side of a semiconductor substrate, wherein the trench defines laterally separate active areas formed of surface regions of the semiconductor substrate; filling an isolation structure in the trench, wherein the isolation structure is filled to a height lower than top surfaces of the active areas; recessing a first group of the active areas from top surfaces of the first group of the active areas, while having top surfaces of a second group of the active areas covered; and forming contact enhancement sidewall spacers to laterally surround top portions of the active areas, respectively.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A memory array, comprising:
   a first group of active areas and a second group of active areas, formed of laterally separate surface portions of a semiconductor substrate, wherein top surfaces of the first group of the active areas are recessed with respect to top surfaces of the second group of the active areas;
   capacitor contacts disposed on the first group of active areas and the second group of active areas, respectively;
   an isolation structure, extending between the first group of active areas and the second group of active areas, and in contact with bottom portions of the first group of active areas and the second group of active areas; and
   contact enhancement caps, capping top portions of the first group of active areas and the second group of the active areas, respectively, wherein the capacitor contacts penetrate through the contact enhancement caps to directly contact with the first group of active areas and the second group of the active areas, respectively;
   wherein the contact enhancement caps respectively comprise:
      a contact enhancement layer, lying the top surface of one of the first group of active areas and the second group of active areas; and
      a contact enhancement sidewall spacer, laterally surrounding the top portion of the one of the first group of active areas and the second group of active areas;
      wherein the contact enhancement sidewall spacers of a first group of the contact enhancement caps covering the top portions of the first group of the active areas are shorter in height as compared to the contact enhancement sidewall spacers of a second group of the contact enhancement caps covering the top portions of the second group of the active areas.

2. The memory array according to claim 1, wherein the contact enhancement caps cover the top surfaces of the first group of active areas and the second group of active areas and laterally surround the top portions of the first group of active areas and the second group of active areas.

3. The memory array according to claim 1, wherein top corners of a first group of the contact enhancement caps covering the top portions of the first group of the active areas are spaced apart along a lateral direction and a vertical direction from top corners of a second group of the contact enhancement caps covering the top portions of the second group of the active areas.

4. The memory array according to claim 1, wherein the contact enhancement layers of a first group of the contact enhancement caps covering the top portions of the first group of the active areas are lower than the contact enhancement layers of a second group of the contact enhancement caps covering the top portions of the second group of the active areas.

5. The memory array according to claim 1, wherein the contact enhancement sidewall spacers extend from a top surface of the isolation structure to the contact enhancement layers.

6. The memory array according to claim 1, wherein the contact enhancement caps are semiconductive or conductive.

* * * * *